United States Patent

Koga

[11] Patent Number: 4,468,769
[45] Date of Patent: Aug. 28, 1984

[54] ERROR CORRECTING SYSTEM FOR CORRECTING TWO OR THREE SIMULTANEOUS ERRORS IN A CODE

[75] Inventor: Keiichiro Koga, Urawa, Japan

[73] Assignee: Kokusai Denshin Denwa Co., Ltd., Tokyo, Japan

[21] Appl. No.: 349,319

[22] Filed: Feb. 16, 1982

[30] Foreign Application Priority Data

Feb. 18, 1981 [JP] Japan .................... 56-21408
Jul. 22, 1981 [JP] Japan .................... 56-113617

[51] Int. Cl.$^3$ ............................. G06F 11/10
[52] U.S. Cl. .................................... 371/37
[58] Field of Search .................... 371/37, 38

[56] References Cited

U.S. PATENT DOCUMENTS

| | | | |
|---|---|---|---|
| 3,781,791 | 12/1973 | Sullivan | 371/37 |
| 4,030,067 | 6/1977 | Howell et al. | 371/37 |
| 4,064,483 | 12/1977 | Takezono et al. | 371/37 |
| 4,099,160 | 7/1978 | Flagg | 371/37 |
| 4,107,652 | 8/1978 | Tanahashi et al. | 371/37 |
| 4,360,916 | 11/1982 | Kustedjo et al. | 371/37 |

Primary Examiner—Charles E. Atkinson
Attorney, Agent, or Firm—Armstrong, Nikaido Marmelstein & Kubovcik

[57] ABSTRACT

An improved two or three error correcting system for BCH code (Bose, Chaudhuri, Hocquenghem code) has been found. In case of a two error correction system, a first syndrome $A_1$ and a second syndrome $A_2$ are obtained from a reception code $C'=(a_1', a_2', \ldots, a_n')$:

$$A_1 = \sum_{s=1}^{n} a_s' \alpha^{n-s}, \quad A_2 = \sum_{s=1}^{n} a_s' \alpha^{3(n-s)}$$

Then, $S_1 = A_1 + \alpha^{n-t}$, and $S_2 = A_2 + \alpha^{3(n-t)}$ are obtained, for every value of t, where n is a code length, t is an integer equal to or less than n, and $\alpha$ is a primitive element of a Galois field. When $A_1 \neq 0$, a t'th bit $a_t'$ is corrected by inverting the same on the condition that the t'th bit of $S_2$ is equal to the t'th bit of $S_1^3$. When $A_1 = 0$, it is clear that no error exists, and no correction is performed. In case of a three error correction system, a third syndrome $$A_3 = \sum_{s=1}^{n} a_s' \alpha^{5(n-s)},$$

and $S_3 = A_3 + \alpha^{5(n-t)}$ are obtained further for every value of t, and a correction is performed by inverting the t'th bit according to the value of $EL(t) = S_1^6 + S_2^2 + S_1^3 S_2 + S_1 S_3$ when $A_1^3 + A_2 \neq 0$, or the value of $S_1$ when $A_1^3 + A_2 = 0$. The structure of the present system is simple since said values $S_2$, $S_3$ and $EL(t)$ are obtained merely by a ROM table and an exclusive-OR circuit.

3 Claims, 4 Drawing Figures

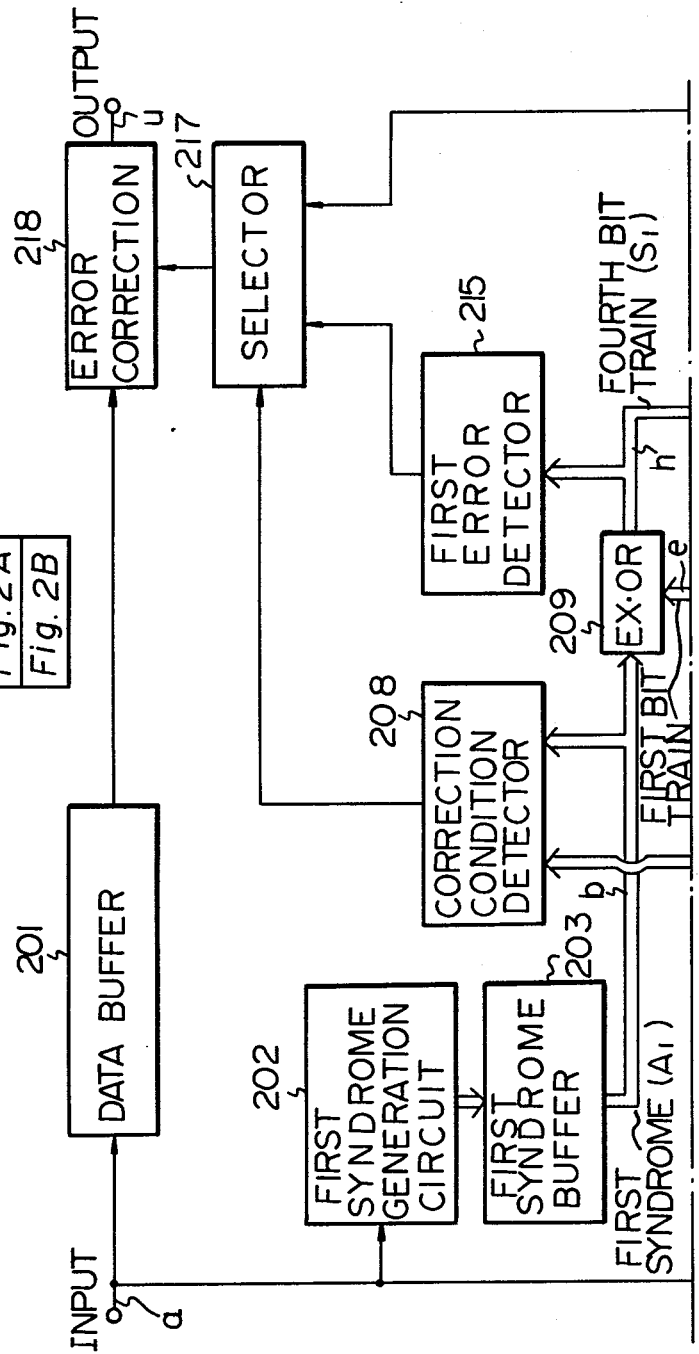

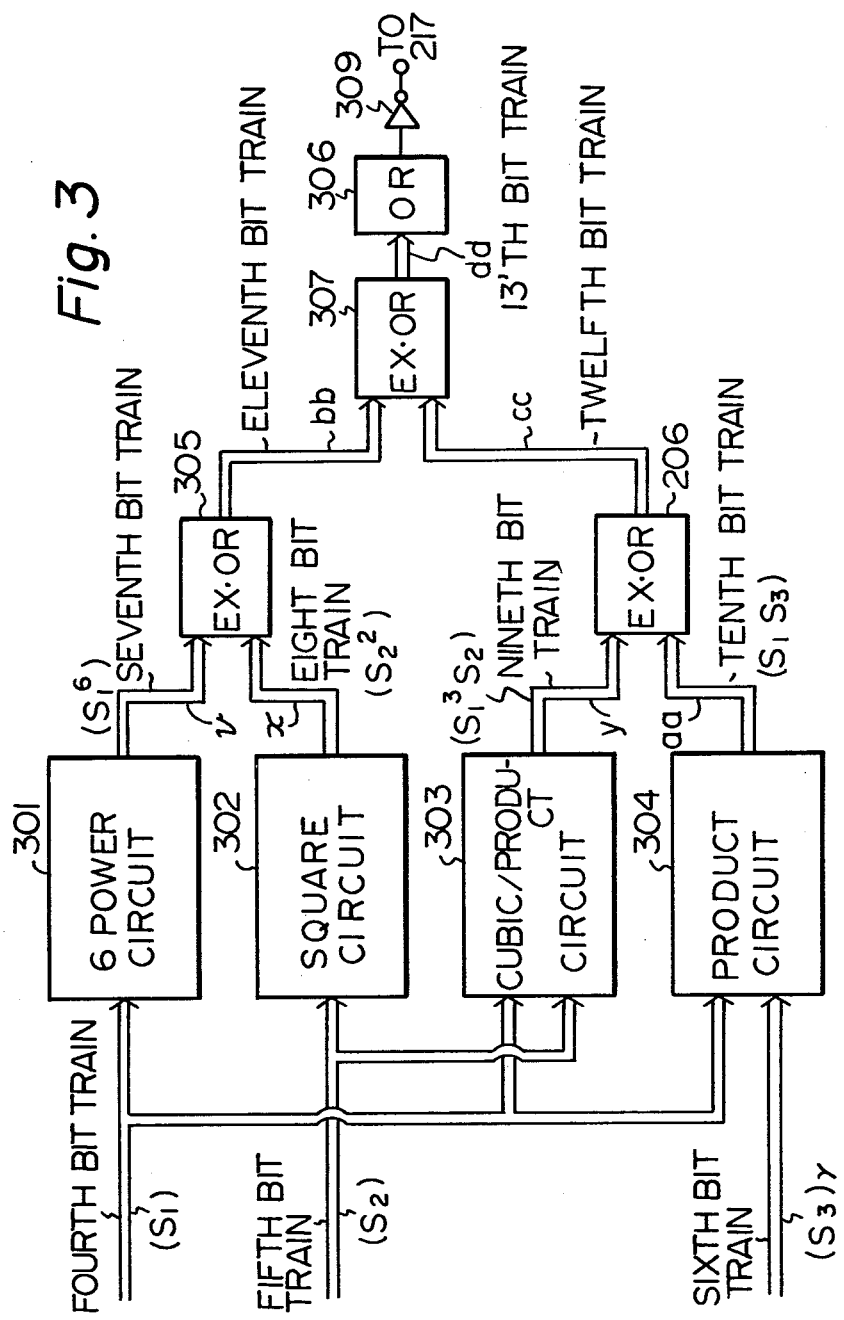

ERROR CORRECTING SYSTEM FOR CORRECTING TWO OR THREE SIMULTANEOUS ERRORS IN A CODE

BACKGROUND OF THE INVENTION

The present invention relates to an error correction system for automatically correcting the errors in a digital transmission system and/or a digital memory, and in particular, relates to such a system which corrects the simultaneous two or three errors.

A prior error correction system transmits a series of information bits together with some test bits, and a transmission error is automatically corrected in a reception side according to the test bits. A BCH (Bose, Chaudhuri, Hocquenghem code) is one of the error correction codes with some test bits. Said BCH code can adapt to a variety of code lengths, and has an excellent error correction capability in a given number of test bits. Among the BCH codes, a single error correction code, a two error correction code, and a three error correction code are typical. The present invention relates to an error correction system which corrects two or three errors in each word.

First, a two-error correction system is described.

One of the prior arts calculates the value $A_2/A_1 + A_2^2$ from the first and the second syndromes $A_1$ and $A_2$ which will be described later, and using said value, the error position polynominal;

$$\sigma(Z)=1+A_1Z+(A_2/A_1+A_1^2)Z^2$$

is produced. Then, $\alpha^{-t}$ ($t=1, 2, \ldots,$ and $\alpha$ is a primitive element of a Galois field) is substituted to the value Z in the above equation, and the position that the value of said equation is zero, is the position of the error. However, said prior art has the disadvantage that a large amount of the calculation process is necessary to calculate the division $A_2/A_1$.

Another prior art is the ROM (Read-Only-Memory) table method, in which a syndrome is produced in a feedback shift register which corresponds to a generation polynominal by inputting a reception code in said register, and consulting with a ROM table which shows the relations with the pattern of a syndrome and an error position. This method has the advantage that the error correction is performed with a simple structure. However, it has the disadvantage that the capacity or the number of words of a ROM table is too large when the degree of the generation polynominal is high, since that ROM table is consulted with the address having the same number of bits as the degree of the generation polynominal. At present, when the degree of the generation polynominal is higher than 16, the ROM table is not obtained with a reasonable size.

In a three error correction system, a first syndrome $A_1$, a second syndrome $A_2$ and a third syndrome $A_3$ are calculated. The calculation of those syndromes is described later. Then, the error position polynominal $\sigma(Z)$ is calculated as follows.

$$\sigma(Z) = 1 + A_1 Z + \frac{A_1^2 A_2 + A_3}{A_1^3 + A_2} Z^2 +$$

-continued $$\left( A_1^3 + A_2 + \frac{A_1(A_1^2 A_2 + A_3)}{A_1^3 + A_2} \right) Z^3 \text{ (in case of } A_1^3 + A_2 \neq 0\text{)}$$

$\sigma(Z) = 1 + A_1 Z$ (in case of $A_1^3 + A_2 = 0$)

Then, $\alpha^t$ ($t=1, 2, \ldots, n$) is substituted in said $\sigma(Z)$, and determines that the value t which provides $\sigma(Z)=0$ indicates the errored position. The correction is performed by inverting the data at the position t.

However, that prior system has the disadvantage that a complicated divider must be utilized for calculating the above equations.

SUMMARY OF THE INVENTION

It is an object, therefore, of the present invention to overcome the disadvantages and limitations of a prior error correction system by providing a new and improved error correction system.

It is also an object of the present invention to provide an error correction system for correcting two or three simultaneous errors with a simple structure which is performed mainly by a shift register, a ROM table, and an exclusive-OR circuit, but does not have a complicated divider.

In case of a two-error correction system, a first syndrome $A_1$ and a second syndrome $A_2$ are calculated using a shift register from a reception BCH code $C' = (a_1', a_2', \ldots, a_n')$, according to the equations:

$$A_1 = \sum_{s=1}^{n} a_s' \alpha^{n-s}, \text{ and } A_2 = \sum_{s=1}^{n} a_s' \alpha^{3(n-s)}$$

Then, $S_1 = A_1 + \alpha^{n-t}$, and $S_2 = A_2 + \alpha^{3(n-t)}$ are obtained, for every value of t, where n is a code length, t is an integer equal to or less than n, and $\alpha$ is a primitive element of a Galois field. When $A_1 \neq 0$, a t'th bit $a_t'$ of the code C' is corrected by inverting the same on the condition that the t'th bit of $S_2$ is equal to the t'th bit of $S_1^3$. When $A_1 = 0$, no correction is performed, since there exists no error.

In case of a three error correction system, a third syndrome $$A_3 = \sum_{s=1}^{n} a_s' \alpha^{5(n-t)},$$

and $S_3 = A_3 + \alpha^{5(n-t)}$ are further obtained for every value of t. Then, the correction is performed by inverting the t'th bit of the code C' according to the value of $EL(t) = S_1^6 + S_2^2 + S_1^3 S_2 + S_1 S_3$ when $A_1^3 + A_2 \neq 0$, or the value of $S_1$ when $A_1^3 + A_2 = 0$.

BRIEF DESCRIPTION OF THE DRAWINGS

The foregoing and other objects, features, and attendant advantages of the present invention will be appreciated as the same become better understood by means of the following description and accompanying drawings wherein:

FIG. 3 is a block diagram of the second error detector in FIG. 2.

DESCRIPTION OF THE PREFERRED EMBODIMENTS

Figure 1:
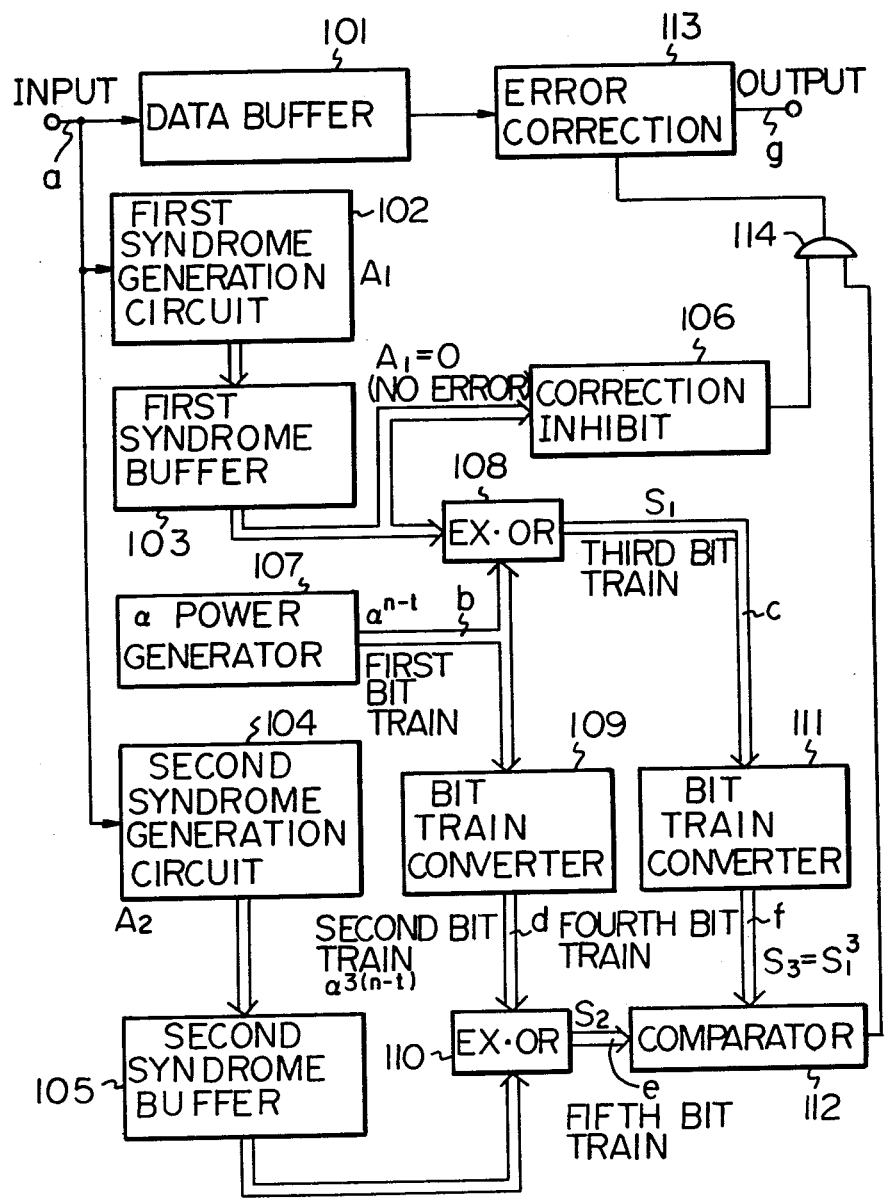
FIG. 1 is a block diagram of the two-error correction system according to the present invention, FIG. 2, comprised of FIG. 2A and FIG. 2B, is a block diagram of the three-error correction system according to the present invention.

First, the theoretical principle of the two-error correction system according to the present invention is described.

In a two-error correction BCH code, a code C has k bits of information $(a_1, a_2, \ldots, a_k)$ and L bits of test bits $(a_{k+1}, a_{k+2}, \ldots, a_{k+L})$. Thus, a code word has k+L bits and is expressed as follows:

$$C = (a_1, a_2, \ldots, a_k, a_{k+1}, a_{k+2}, \ldots, a_{k+L})$$

where k and L are defined so that $k = 2^m - 2m - 1$, and $L = 2m$ where m is an integer larger than 4.

The code length $2^m - 1$ is expressed n hereinafter, then, $$C = (a_1, a_2, \ldots, a_{n-1}, a_n)$$

A test bit is determined so that a code word satisfies the following equation, $$HC^T = 0$$

where $C^T$ is a transposed matrix of the matrix C.

The parity test matrix H is expressed by using the primitive element $\alpha$ of $GF(2^m)$ (Galois field) as follows:

$$H = \begin{pmatrix} \alpha^{n-1}, \alpha^{n-2}, \ldots, \alpha^2, \alpha, \alpha^0 \\ \alpha^{3(n-1)}, \alpha^{3(n-2)}, \ldots, \alpha^6, \alpha^3, \alpha^0 \end{pmatrix}$$

where $\alpha$ is the row vector with m elements. Each element of the matrix H is expressed by the row vectors each having m elements.

A code word C is transmitted, then received in the form of the code word C':

$$C' = (a_1', a_2', \ldots, a_{n-1}', a_n')$$

where $C' = C + e$.

The vector e is a row vector in which an element is "1" at an error position, and is "0" at a correct position.

$$e = (e_1, e_2, \ldots, e_{n-1}, e_n)$$

According to the present invention, the first syndrome $A_1$, and the second syndrome $A_2$ are calculated according to the following equations.

$$A_1 = \sum_{s=1}^{n} a_s' \alpha^{n-s}$$

$$A_2 = \sum_{s=1}^{n} a_s' \alpha^{3(n-s)}$$

Since $HC^T = 0$ is satisfied, the following two equations are satisfied.

$$A_1 = \sum_{s=1}^{n} e_s \alpha^{n-s}$$

$$A_2 = \sum_{s=1}^{n} e_s \alpha^{3(n-s)}$$

The generation of the syndromes $A_1$ and $A_2$ is described in "THE THEORY OF ERROR-CORRECTING CODES, PART I", by F. J. MacWilliams and N. J. A. Sloane, pages 270–272, published by North-Holland Publishing Company. That is to say, the first syndrome $A_1$ is obtained by applying a reception code into a feedback shift register which corresponds to a minimum polynominal of $\alpha$, and that first syndrome $A_1$ is completed in said shift register when the last bit is applied to the shift register. The second syndrome $A_2$ is obtained through the steps of applying a reception code into a feedback shift register which corresponds to a minimum polynominal of $\alpha^3$, and converting the content of the bit train in the shift register by using an exclusive-OR circuit when the last bit is applied to the shift register. Without an error in the reception code word, both the first syndrome and the second syndrome are of course zero.

Next, the trains of $\alpha^{n-t}$, and $\alpha^{3(n-t)}$ are generated for $t = 1$ to $t = n$. The train $\alpha^{n-t}$ is called the first bit train, and the train $\alpha^{3(n-t)}$ is called the second bit train. The first bit train is obtained by the steps of initiating the feedback shift register which corresponds to the minimum polynominal of $\alpha$ by $\alpha^n = 1$, and shifting the content of the same by t bit positions. The second bit train $\alpha^{3(n-t)}$ is obtained by calculating the cubic of the first bit train $\alpha^{n-t}$.

The third bit train $S_1$, and the fifth bit train $S_2$ are defined as follows.

$$S_1 = A_1 + \alpha^{n-t}$$

$$S_2 = A_2 + \alpha^{3(n-t)}$$

Further, the fourth bit train $S_3$ is defined as follows.

$$S_3 = S_1^3$$

Next, $S_2$ is compared with $S_3$ for each value of t. When $S_2$ is equal to $S_3$ for the particular value of t, the t'th bit $a_t'$ of the reception code is determined to be in the error, and then, that bit $a_t'$ is corrected by inverting the same.

Now, the example of the correction in case that the number of the error bits is less than 2 is shown below.

(a) When only one bit (i'th bit) is in error:
In this case, the following relations are satisfied.

$$A_1 = \alpha^{n-i}$$

$$A_2 = \alpha^{3(n-i)}$$

$$S_1 = A_1 + \alpha^{n-t} = \alpha^{n-i} + \alpha^{n-t}$$

$$S_2 = A_2 + \alpha^{3(n-t)} = \alpha^{3(n-i)} + \alpha^{3(n-t)}$$

$$S_3 = S_1^3 = (\alpha^{n-i} + \alpha^{n-t})^3$$

$$= \alpha^{3(n-i)} + \alpha^{3(n-t)} + \alpha^{2(n-i)+(n-t)} + \alpha^{2(n-t)+(n-i)}$$

Accordingly, $S_2 + S_3$ is shown below.

$$S_2 + S_3 = \alpha^{2(n-i)+(n-t)} + \alpha^{2(n-t)+(n-i)}$$

$$= \alpha^{2n-i-t}(\alpha^{n-i} + \alpha^{n-t})$$

Therefore, $S_2+S_3$ is zero when $t=i$ ($\alpha^{n-i}=\alpha^{n-t}$), but is not zero when t is not equal to that value. That is to say, $S_2$ coincides with $S_3$ only when $t=i$. Then, the bit $a_i'$ is corrected by inverting the same, and no bit except $a_i'$ is not inverted.

(b) When two bits $a_i'$ and $a_j'$ in i'th and j'th positions are in error:

In this case, the following relations are satisfied.

$$A_1=\alpha^{n-i}+\alpha^{n-j}$$

$$A_2=\alpha^{3(n-i)}+\alpha^{3(n-j)}$$

$$S_1=A_1+\alpha^{n-t}=\alpha^{n-i}+\alpha^{n-j}+\alpha^{n-t}$$

$$S_2=A_2+\alpha^{3(n-t)}=\alpha^{3(n-i)}+\alpha^{3(n-j)}+\alpha^{3(n-t)}$$

$$S_3=S_1{}^3=\alpha^{3(n-i)}+\alpha^{3(n-j)}+\alpha^{3(n-t)}$$

$$+\alpha^{2(n-t)}(\alpha^{n-i}+\alpha^{n-j})$$
$$+\alpha^{n-t}(\alpha^{2(n-i)}+\alpha^{2(n-j)})$$
$$+\alpha^{2n-i-j}(\alpha^{n-i}+\alpha^{n-j})$$

Accordingly, $S_2+S_3$ is shown below.

$$S_2+S_3=(\alpha^{n-i}+\alpha^{n-j})(\alpha^{n-t}+\alpha^{n-i})(\alpha^{n-t}+\alpha^{n-j})$$

Therefore, $S_2+S_3$ is zero when $t=i$ or $t=j$, but is not zero when t has other values. Therefore, the bit positions $a_i'$ and $a_j'$ are corrected by inverting the same, and no bit position except $a_i'$ and $a_j'$ is not inverted. When there is no error, $S_2$ coincides with $S_3$ for all the values of t, and therefore, the bit inversion must not be carried out in spite of that condition $S_2=S_3$. Since $A_1=0$ is satisfied when $S_2=S_3$, the condition $A_1=0$ prohibits the inversion of any bits.

Now, the error correction system according to the present invention is explained in accordance with the drawing, in which the code length n is $2^m-1$. As explained above, the present system handles an element of a Galois field in the decoding procedure. It has been well known that an element of a Galois field $GF(2^m)$ is expressed by the linear coupling of 1, $\alpha$, $\alpha^2$, ..., $\alpha^{m-2}$, $\alpha^{m-1}$ where $\alpha$ is the primitive element. In the present embodiment, an element of a Galois field has m number of bits which compose a train of coefficients of said linear coupling.

FIG. 1 shows a block diagram of a two-error correction system according to the present invention. In the figure, the reception input data (a) is applied to the data buffer 101, the first syndrome generation circuit 102, and the second syndrome generation circuit 104. The data buffer 101 is a shift register with n+1 bit positions in which n is the word length of a reception code, and the additional one (1) bit is necessary to transfer the syndrome generated in the syndrome generator to the syndrome buffer.

The first syndrome generation circuit is composed of the m steps of feedback shift register which corresponds to the minimum polynominal of first element $\alpha$ of $GF(2^m)$. The second syndrome generation circuit is composed of the m bits of feedback shift register corresponding to the minimum polynominal of $\alpha^3$, and a bit train converter which is implemented by an exclusive-OR circuit. When the last bit of the reception code is applied to the data buffer 101, the first syndrome is generated in the first syndrome generation circuit 102, and the second syndrome is generated in the second syndrome generation circuit 104. The syndromes thus generated are transferred to the first syndrome buffer 103, and the second syndrome buffer 105, since the syndromes are cleared when the next reception code is applied to the syndrome generation circuits. The reception code stored in the data buffer 101 is applied to the error correction circuit 113 one bit after another bit from the first bit. When the t'th bit ($t=1, 2, \ldots, n$) is output from the data buffer 101 and is applied to the error correction circuit 113, $\alpha$ power generator 107 provides the first bit train having m bits which indicate $\alpha^{n-t}$. The $\alpha$ power generator 107 is composed of a feedback shift register corresponding to the minimum polynominal of $\alpha$. The first bit train is applied to the exclusive-OR circuit 108 which also receives the first syndrome, and the output of the exclusive-OR circuit 108 is the third bit train.

The first bit train is also applied to the bit train converter 109 which is implemented by a ROM. Said bit train converter 109 converts the first bit train indicating $\alpha^{n-t}$ to the second bit train with m bits indicating $\alpha^{3(n-t)}$. Said second bit train is applied to the exclusive-OR circuit 110 which also receives the second syndrome, and the output of the exclusive-OR circuit 110 is the fifth bit train. The third bit train from the exclusive-OR circuit 108 is applied to the bit train converter 111 which is implemented by a ROM, which provides the fourth bit train indicating $\alpha^{3j}$ for the element $\alpha^3$ of $GF(2^m)$ of the third bit train. The fourth bit train is compared with the fifth bit train in the comparator 112 which has an exclusive-OR circuit, an adder and a "not" circuit. The comparator 112 provides the output "1" only when all the bit of the fourth bit train are the same as the corresponding bits of the fifth bit train.

The correction inhibit circuit 106 which is composed of an adder provides the output "0" when the first syndrome is completely zero, and provides the output "1" when at least one bit of the first syndrome is not zero. The output of the correction inhibit circuit 106, and the output of the comparator 112 are applied to the AND circuit 114. Therefore, the output of the AND circuit 114 is "0" when the output of the correction inhibit circuit 106 is zero, or coincides with the output of the comparator 112 when the output of the correction inhibit circuit 106 is "1".

The error correction circuit 113 is an exclusive-OR circuit to which the output of the data buffer 101 and the output of the AND circuit 114 are applied. Accordingly, the error correction circuit 113 inverts the output of the data buffer 101, only when the output of the AND circuit 114 is "1", that is to say, when the output of the comparator 112 is "1" and the output of the correction inhibit circuit 106 is "1". As apparent from the above, when the output of the AND circuit 114 is "1", the error is corrected in the error correction circuit 113 by inverting the related bit.

In the above embodiment, it is supposed that the number of the elements of the Galois field (1, $\alpha$, $\alpha^2$, ..., $\alpha^{m-1}$) is m in the first syndrome, the second syndrome, the first bit train, the second bit train, the third bit train, the fourth bit train, and the fifth bit train. If the second syndrome, the second bit train, the fourth bit train and the fifth bit train are expressed with the coefficient trains of the elements of the Galois field, 1, $\beta$, $\beta^2$, ..., $\beta^{m-1}$ where $\beta=\alpha^3$, the bit train converter in the second syndrome generation circuit 104 is unnecessary. In this case, the content of the ROMs in the bit train converters 109 and 111 is modified but the capacity of those ROMs does not change. Therefore, the structure of the system is simplified.

Comparing the present error correction system with a prior error correction system, the capacity of the ROM of the present invention is smaller than that in a prior art, for all the two-error correction BCH code, since the bit length of the bit trains $\alpha^{n-t}$, $\alpha^{3(n-t)}$, $A_1$, $A_2$, $S_1$, $S_2$ and $S_3$ is merely half of the degrees of the generation polynominal. Since the capacity of the present ROM is small, the complicated calculation, for instance $S_3 = S_1^3$, may be implemented by using a ROM table without increasing the total capacity of the ROM.

Figure 2B:
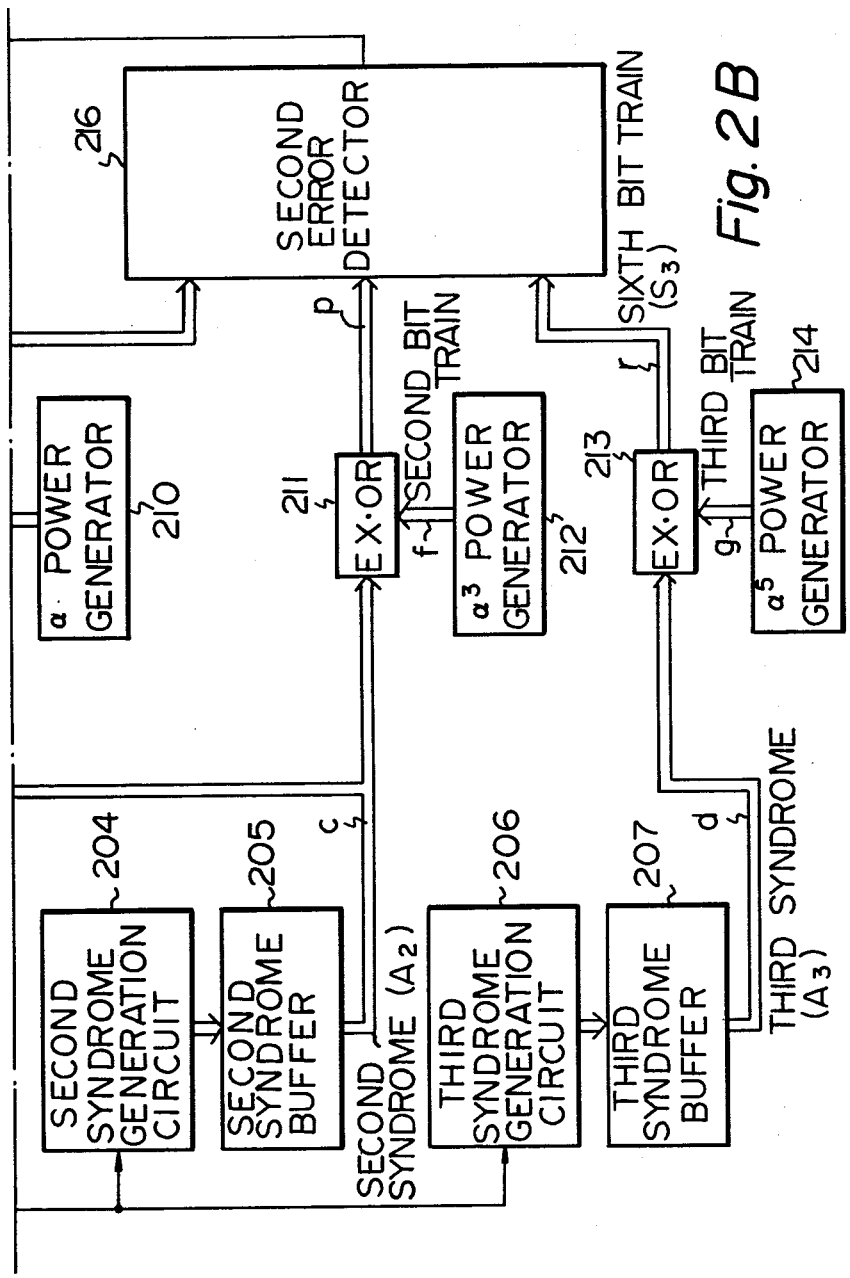

Now, the three-error correction system according to the present invention is described in accordance with FIGS. 2 and 3.

In the three-error correction BCH code, a code word C has k bits of information $(a_1, a_2, \ldots, a_k)$ and q bits of test bits $(a_{k+1}, a_{k+2}, \ldots, a_{k+q})$, then a code word C is expressed as follows:

$$C = (a_1, a_2, \ldots, a_k, a_{k+1}, \ldots, a_{k+q})$$

where $k = 2^m - 3m - 1$, and $q = 3m$, where m is an integer larger than 4. The code length $k + q = 2^m - 1$ is expressed as n. Then, $$C = (a_1, a_2, \ldots, a_{n-1}, a_n)$$

a test bit is determined so that the relation $HC^T = 0$ is satisfied, where $C^T$ is the transposed matrix of the matrix C, and H is a parity test matrix which is shown below by using a primitive element $\alpha$ of a Galois field $GF(2^m)$ with $2^m$ number of elements.

$$H = \begin{bmatrix} \alpha^{n-1}, \alpha^{n-2}, \ldots, \alpha^2, \alpha, \alpha^0 \\ \alpha^{3(n-1)}, \alpha^{3(n-2)}, \ldots, \alpha^{3 \cdot 2}, \alpha^3, \alpha^0 \\ \alpha^{5(n-1)}, \alpha^{5(n-2)}, \ldots, \alpha^{5 \cdot 2}, \alpha^5, \alpha^0 \end{bmatrix}$$

Each element $\alpha^W$ (W = 0, 1, ..., n-1) of the matrix H is a row vector having m number of elements.

When C is changed to C' by error:

$$C' = (a_1', a_2, a_3', \ldots, a_{n-1}', a_n)$$

C' is the sum of the original vector C and the vector e $$C' = C + e$$

where an element of e is 1 at an errored position, and is 0 at a correct position.

$$e = (e_1, e_2, \ldots, e_{n-1}, e_n)$$

According to the present invention, a first syndrome $A_1$, a second syndrome $A_2$, and a third syndrome $A_3$ are calculated according to the following equations.

$$A_1 = \sum_{s=1}^{n} a_s' \alpha^{n-s}$$

$$A_2 = \sum_{s=1}^{n} a_s' \alpha^{3(n-s)}$$

$$A_3 = \sum_{s=1}^{n} a_s' \alpha^{5(n-s)}$$

The above three equations are changed as follows by using the relations $HC^T = 0$, $$A_1 = \sum_{s=1}^{n} e_s \alpha^{n-s}$$

$$A_2 = \sum_{s=1}^{n} e_s \alpha^{3(n-s)}$$

$$A_3 = \sum_{s=1}^{n} e_s \alpha^{5(n-s)}$$

The generation of said syndromes is described in said document ("THE THEORY OF ERROR-CORRECTING CODES, PART I" by F. J. MacWilliams and N. J. A. Sloane, pages 270–272, published by North-Holland Publishing Company). That is to say, the first syndrome $A_1$ is generated by the steps of applying the bits from $a_1'$ to $a_2'$ of the reception signal C' to a feedback shift register corresponding to a minimum polynominal of $\alpha$, and is completed when the final bit $a_n'$ is applied to the shift register. The second syndrome $A_2$ is generated by the steps of applying the code C to the feedback shift register corresponding to the minimum polynominal of $\alpha^3$, and converting the content of the shift register using an exclusive-OR circuit when the final bit is applied to the shift register. The third syndrome $A_3$ is generated by the steps of applying the code C to the feedback shift register corresponding to the minimum polynominal of $\alpha^5$, and converting the content of the shift register using an exclusive-OR circuit when the final bit is applied to the shift register.

Next, the value $A_1^3 + A_2$ is calculated by using said first syndrome and the second syndrome. The value $A_1^3$ is obtained by using a cubic generator which is implemented by a ROM table, and the addition of $A_1^3$ and $A_2$ is carried out simply by using an exclusive-OR circuit.

Next, the bit trains $\alpha^{n-t}$, $\alpha^{3(n-t)}$, and $\alpha^{5(n-t)}$ are calculated for t=1 through t=n. $\alpha^{n-t}$ is a first bit train, $\alpha^{3(n-t)}$ is called a second bit train, and $\alpha^{5(n-t)}$ is called a third bit train. The bit train $\alpha^{n-t}$ is obtained by initiating a feedback shift register which corresponds to a minimum polynominal of $\alpha$ with $\alpha^n = 1$, and shifting the content of the shift register by t bit positions. The $\alpha^{3(n-t)}$ is obtained by using a cubic ROM generator with the input $\alpha^{n-t}$. The $\alpha^{5(n-t)}$ is similarly obtained by using a cubic ROM generator with the input $\alpha^{n-t}$. Alternatively, $\alpha^{3(n-t)}$ and $\alpha^{5(n-t)}$ are obtained by using a shift register with the initial value $\alpha^{3n} = \alpha^{5n} = 1$, and shifting the content of the same by t bit positions, on the condition that the shift register provides the multiplication of $\alpha^{-3}$ or $\alpha^{-5}$ in every shift, as described in page 120 of "A CODE THEORY" by Miyakawa et al, published by Shokodo, Japan.

Next, a fourth bit train $S_1$, a fifth bit train $S_2$, and a sixth bit train $S_3$ are calculated according to the following equations by using the first syndrome $A_1$, the second syndrome $A_2$, the third syndrome $A_3$, $\alpha^{n-t}$, $\alpha^{3(n-t)}$, and $\alpha^{5(n-t)}$ for each value of t.

$$S_1 = A_1 + \alpha^{n-t}$$

$$S_2 = A_2 + \alpha^{3(n-t)}$$

$$S_3 = A_3 + \alpha^{5(n-t)}$$

The addition in those equations is performed simply by using an exclusive-OR circuit.

Next, the value EL(t) is calculated according to the following equation.

$$EL(t) = S_1^6 + S_2^2 + S_1^3 S_2 + S_1 S_3$$

In the above equation, the term $S_1^6$ is obtained by using a 6'th power ROM table with the input $S_1$, $S_2^2$ and $S_1^3$ are also obtained by using a ROM table, the multiplication $(S_1^3)S_2$ and $S_1 S_3$ is performed also by using a ROM table, and the addition of each terms is performed by using an exclusive-OR circuit.

When the value $A_1^3 + A_2$ is zero, it is determined that the t'th bit $a_t'$ in the vector C is in error where the value t provides the relation $S_1 = 0$ ($S_1(t) = 0$), and then, that t'th bit $a_t'$ is inverted to correct the error.

When the value $A_1^3 + A_2$ is not zero, the value $EL(t)$ is measured for each value of t, and if $EL(t) = 0$, it is determined that the t'th bit $a_t'$ in the vector C is in error. Therefore, that t'th bit $a_t'$ is corrected by inverting the same.

As explained above, according to the present invention, a simple operation is repeated for each bits of a code word, but a complicated error position polynominal in a prior art is not used. Therefore, a simple error correction system is obtained.

Now, the error correction operation in case the number of errors is less than 3 is described.

(a) When there is no error:

In this case, the relations $A_1 = A_2 = A_3 = 0$ are satisfied and then the relations $A_1^3 + A_2 = 0$ are satisfied. Therefore, the error correction is performed according to the value of $S_1$. However, the value $S_1$ ($= A_1 + \alpha^{n-t} = \alpha^{n-t}$) is not zero for any value of t. Therefore, no bit in the vector C is inverted.

(b) When i'th bit $a_i'$ is in error:

In this case, $A_1 = \alpha^{n-i}$, and $A_2 = \alpha^{3(n-i)}$ are satisfied. Therefore, the following relation is satisfied.

$$A_1^3 + A_2 = 0$$

Therefore, the error correction is performed according to the value of $S_1$.

$$S_1 = A_1 + \alpha^{n-t} = \alpha^{n-i} + \alpha^{n-t}$$

The value $S_1$ is zero only when $t = i$ is satisfied, but $S_1$ is not zero when t is not equal to i. Therefore, a correct error correction operation is performed.

(c) When i'th bit $a_i'$ and j'th bit $a_j'$ are in error:

In this case, the following relations are satisfied.

$$A_1 = \alpha^{n-i} + \alpha^{n-j}$$

$$A_2 = \alpha^{3(n-i)} + \alpha^{3(n-j)}$$

$$A_3 = \alpha^{5(n-i)} + \alpha^{5(n-j)}$$

$$A_1^3 + A_2 = \alpha^{(n-i)} \alpha^{n-j} (\alpha^{n-i} + \alpha^{n-j})$$

Since $i \neq j$, $A_1^3 + A_2 \neq 0$, then, the error correction is performed according to the value $EL(t)$. In this case, the following relations are satisfied.

$$S_1 = A_1 + \alpha^{n-t} = \alpha^{n-i} + \alpha^{n-j} + \alpha^{n-t}$$

$$S_2 = A_2 + \alpha^{3(n-t)} = \alpha^{3(n-i)} + \alpha^{3(n-j)} + \alpha^{3(n-t)}$$

$$S_3 = A_3 + \alpha^{5(n-t)} = \alpha^{5(n-i)} + \alpha^{5(n-j)} + \alpha^{5(n-t)}$$

$$EL(t) = S_1^6 + S_2^2 + S_1^3 S_2 + S_1 S_2$$

$$= \alpha^{n-i} \alpha^{n-j} \alpha^{n-t} (\alpha^{n-i} + \alpha^{n-j})(\alpha^{n-t} + \alpha^{n-i})$$

$$(\alpha^{n-t} + \alpha^{n-j})$$

Accordingly, $EL(t)$ is zero only when $t = i$ or $t = j$, but $EL(t)$ is not zero if t has other values. Accordingly, a correct error correction is performed.

(d) When i'th bit $a_i'$, j'th bit $a_j'$ and k'th bit $a_k'$ are in error:

In this case, the following relations are satisfied.

$$A_1 = \alpha^{n-i} + \alpha^{n-j} + \alpha^{n-k}$$

$$A_2 = \alpha^{3(n-i)} + \alpha^{3(n-j)} + \alpha^{3(n-k)}$$

$$A_3 = \alpha^{5(n-i)} + \alpha^{5(n-j)} + \alpha^{5(n-k)}$$

$$A_1^3 + A_2 = (\alpha^{n-i} + \alpha^{n-j})(\alpha^{n-j} + \alpha^{n-k})(\alpha^{n-k} + \alpha^{n-i})$$

Since $i \neq j$, $j \neq k$, and $k \neq i$ are satisfied, $A_1^3 + A_2 \neq 0$ is satisfied. Therefore, the error correction is performed according to the value $EL(t)$.

In this case, the following relations are satisfied.

$$S_1 = A_1 + \alpha^{n-t} = \alpha^{n-i} + \alpha^{n-j} + \alpha^{n-k} + \alpha^{n-t}$$

$$S_2 = A_2 + \alpha^{3(n-t)}$$

$$= \alpha^{3(n-i)} + \alpha^{3(n-j)} + \alpha^{3(n-k)} + \alpha^{3(n-t)}$$

$$S_3 = A_3 + \alpha^{5(n-t)}$$

$$= \alpha^{5(n-i)} + \alpha^{5(n-j)} + \alpha^{5(n-k)} + \alpha^{5(n-t)}$$

$$EL(t) = S_1^6 + S_2^2 + S_1^3 S_2 + S_1 S_3$$

$$= (\alpha^{n-i} + \alpha^{n-j})(\alpha^{n-i} + \alpha^{n-k})(\alpha^{n-k} + \alpha^{n-i})$$

$$(\alpha^{n-t} + \alpha^{n-i})(\alpha^{n-t} + \alpha^{n-j})(\alpha^{n-t} + \alpha^{n-k})$$

Accordingly, $EL(t)$ is zero only when t coincides with i, j or k, but it is not zero when t has other values. And then, the correct error correction is performed. As apparent from the above explanation, when the number of error bits is less than three, a correct error operation is performed.

(e) When the second, the fifth, and the eleventh bits are in error in which $n = 15$, and $\alpha$ is the primitive element ($\alpha^4 + \alpha + 1 = 0$) of $GF(2^4)$:

In this case, the following relations are satisfied.

$$A_1 = \alpha^{15-2} + \alpha^{15-5} + \alpha^{15-11} = \alpha^{14}$$

$$A_2 = \alpha^{3(15-2)} + \alpha^{3(15-5)} + \alpha^{3(15-11)} = \alpha^2$$

$$A_3 = \alpha^{5(15-2)} + \alpha^{5(15-5)} + \alpha^{5(15-11)} = \alpha^5$$

$$S_1 = A_1 + \alpha^{15-t} = \alpha^{15-t} + \alpha^{14}$$

$$S_2 = A_2 + \alpha^{3(15-t)} = \alpha^{3(15-t)} + \alpha^2$$

$$S_3 = A_3 + \alpha^{5(15-t)} = \alpha^{5(15-t)} + \alpha^5$$

$$EL(t) = S_1^6 + S_2^2 + S_1^3 S_2 + S_1 S_3$$

$$= \alpha^{7-3t} + \alpha^{6-2t} + \alpha^{10-t} + \alpha^4$$

$$= \alpha^7 (\alpha^{13} + \alpha^{15-t})(\alpha^{10} + \alpha^{15-t})(\alpha^4 + \alpha^{15-t})$$

Accordingly, when t=2, 5 or 11, the value EL(t) is zero, and an error is corrected. Otherwise, EL(t) is not zero.

Now, the structure embodiment of the present three errors correction system is described in accordance with FIGS. 2 and 3.

As described above, the present system handles an element of a Galois field in a decoding procedure. An element of a Galois field $GF(2^m)$ is expressed by a linear coupling of 1, $\alpha$, $\alpha^2$, $\alpha^{m-2}$, $\alpha^{m-1}$ where $\alpha$ is a primitive element. In the present embodiment, an element of a Galois field is a row vector of said linear coupling with m number of bits.

FIG. 2 is a block diagram of the three-error correction system according to the present invention.

In FIG. 2, an input data (a) is applied to a data buffer 201, a first syndrome generation circuit 202, a second syndrome generation circuit 204, and a third syndrome generation circuit 206. The data buffer 201 is composed of a shift register with n+1 bits, where n is the code length of a code word, and an additional one bit is necessary to hold a signal during the transfer of a syndrome from a syndrome generation circuit to a syndrome buffer. The first syndrome generation circuit 202 is composed of a feedback shift register with m bit positions corresponding to a minimum polynominal of a primitive element $\alpha$ of a Galois field $GF(2^m)$. The second syndrome generation circuit 204 is composed of a feedback shift register with m bit positions corresponding to a minimum polynominal of $\alpha^3$, and a bit train converter implemented by an exclusive-OR circuit. The third syndrome generation circuit 206 is composed of a feedback shift register corresponding to a minimum polynominal of $\alpha^5$, and a bit train converter implemented by an exclusive-OR circuit.

When the last bit of an input code word is applied to the data buffer 201, a first syndrome, a second syndrome and a third syndrome are generated in the respective syndrome generation circuits. The syndromes thus generated are transferred to the first syndrome buffer 203, the second syndrome buffer 205, and the third syndrome buffer 206, respectively, since a content in the syndrome generation circuits 202, 204 and 206 is changed by a succeeding input code signal.

The first syndrome $A_1$ and the second syndrome $A_2$ are applied to a correction condition detector 208, which determines if $A_1^3+A_2=0$ is satisfied, and provides the output "0" when $A_1^3+A_2=0$ is satisfied, and provides the output "1" when $A_1^3+A_2=0$ is not satisfied. The output of the detector 208 is applied to a selector 217. The correction condition detector 208 is composed of a ROM cubic circuit, an adder of an exclusive-OR circuit, and a logic circuit for determining if all the bits of the sum of the adder are zero or not.

A code signal stored in the data buffer 201 is applied to an error correction circuit 218 one bit after another bit from the first bit. When the t'th bit (t=1, 2, ..., n) is applied to the error correction circuit 218 from the data buffer 201, a power generator of $\alpha$ 210 provides a first bit train which indicates $\alpha^{n-t}$ and has m bits, an $\alpha^3$ power generator 212 provides a second bit train which indicates $\alpha^{3(n-t)}$ and has m bits, and an $\alpha^5$ power generator 214 provides a third bit train which indicates $\alpha^{5(n-t)}$. The $\alpha$ power generator 210 is composed of a feedback shift register corresponding to a minimum polynominal of $\alpha$. The $\alpha^3$ power generator 212 is composed of a feedback shift register corresponding to a minimum polynominal of $\alpha^3$. The $\alpha^5$ power generator 214 is composed of a feedback shift register corresponding to a minimum polynominal of $\alpha^5$.

An exclusive-OR circuit 209 provides a fourth bit train $S_1=A_1+\alpha^{n-t}$ by providing the exclusive-OR logic between each corresponding bits of the first bit train and the first syndrome.

An exclusive-OR circuit 211 provides a fifth bit train $S_2=A_2+\alpha^{3(n-t)}$ by providing the exclusive-OR logic between the second bit train and the second syndrome. Similarly, an exclusive-OR circuit 213 provides a sixth bit train $S_3=A_3+\alpha^{5(n-t)}$ by the exclusive-OR logic between the third bit train and the third syndrome.

The fourth bit train is applied to a first error detector 215, and a second error detector 216. The fifth bit train and the sixth bit train are applied to the second error detector 216. The first error detector 215 is composed of a logic sum circuit and an inhibit circuit, and provides the output "1" when $S_1$ is 0, and provides the output "0" otherwise, and the output of the first error detector 215 is applied to the selector 217. The second error detector calculates $S_1^6+S_2^2+S_1^3S_2+S_1S_3$ from the fourth bit train ($S_1$), the fifth bit train ($S_2$), and the sixth bit train ($S_3$), applies the output "1" to the selector 217 when said value ($S_1^6+S_2^2+S_1^3S_2+S_1S_2$) is zero, otherwise applies the output "0" to the selector 217.

FIG. 3 shows a block diagram of the second error detector 216. In FIG. 3, the fourth bit train is applied to a 6'th power circuit 301, a cubic/product circuit 303, and a product circuit 304. The fifth bit train is applied to a square circuit 302, and the cubic/product circuit 303. The sixth bit train is applied to the product circuit 304. The sixth power circuit 301 provides a seventh bit train ($S_1^6$). The square circuit 302 provides the eighth bit train ($S_2^2$). The cubic/product circuit 303 provides the ninth bit train ($S_1^3S_2$). The product circuit 304 provides the tenth bit train ($S_1S_3$). The sixth power circuit 301, the square circuit 302 and the cubic/product circuit 303 are composed of a ROM table. An exclusive-OR circuit 305 performs an addition $S_1^6+S_2^2$ by performing an exclusive-OR logic between the corresponding bits of the seventh bit train and the eighth bit train, and the result is an eleventh bit train. An exclusive-OR circuit 306 provides a twelfth bit train ($S_1^3+S_1S_3$) by performing the exclusive-OR logic between the nineth bit train and the train bit train. An exclusive-OR circuit 307 provides a thirteenth bit train ($S_1^6+S_2^2+S_1^3S_2+S_1S_3$) by performing the exclusive-OR logic between the eleventh bit train and the twelfth bit train. A logical OR circuit 308 provides the OR logic of all the bits of the thirteenth bit train, and provides the output "0" when all the bits of $S_1^6+S_2^2+S_1^3S_2+S_1S_3$ are zero, otherwise provides the output "1". An inverter 309 inverts the polarity of the output of the OR circuit 308.

Now back to FIG. 2, the selector 217 which is composed of a logical AND circuit, a logical OR circuit and an inhibit circuit, passes the output of the first error detector 215 when the correction condition detector 208 provides the output "0" indicating that $A_1^3+A_2=0$, or passes the output of the second error detector 216 when the correction condition detector 208 provides the output "1" indicating that $A_1^3+A_2\neq0$.

An error correction circuit 218 is composed of an exclusive-OR circuit which performs the exclusive-OR logic between t'th bit $a_t'$ of the output of the data buffer 201 and the output of the selector 217. Accordingly, the error correction circuit 218 inverts the t'th bit $a_t'$ of the output of the data buffer 201, on the condition that the output of the correction condition detector 208 is "0"

and the output of the first error detector 215 is "1", and that the output of the correction condition detector 208 is "1" and the output of the second error detector 216 is "1". Otherwise, the error correction circuit 218 passes the output of the data buffer 201 as it is without inverting any bit. The output u of the error correction circuit 218 is the corrected output code.

As described above, the present error correcting system is simple in structure as compared with a prior error correcting system.

From the foregoing it will now be apparent that a new and improved error correcting system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An error correction system for correcting two simultaneous errors comprising:
   (a) an input terminal for receiving a code signal,
   (b) a data buffer for storing said code signal,
   (c) a first syndrome generation circuit for providing the first syndrome $A_1$ from the code signal at the input terminal,
   (d) a second syndrome generation circuit for providing the second syndrome $A_2$ from the code signal at the input terminal,
   (e) a correction inhibit circuit for detecting the condition that all the bit positions in said first syndrome $A_1$ are zero,
   (f) means for providing a first bit train which shows an element $\alpha^{n-t}$ of a Galois field for each bit position in a code signal where n is a code length and t is an integer not larger than n for indicating a test bit,
   (g) means for providing a second bit train ($\alpha^{3(n-t)}$) which is the cubic of the first bit train ($\alpha^{n-t}$),
   (h) means for providing a third bit train $S_1$ which is the modulo-2 sum of the element ($A_1$) of the Galois field of the first syndrome and the element ($\alpha^{n-t}$) of the Galois field of the first bit train ($S_1 = A_1 + \alpha^{n-t}$),
   (i) means for providing a fourth bit train $S_3$ wherein ($S_3 = S_1^3$) which is the cubic of the element of the Galois field of the third bit train,
   (j) means for providing a fifth bit train $S_2$ ($S_2 = A_2 + \alpha^{3(n-t)}$) which is the modulo-2 sum of the element $A_2$ of the Galois field of the second syndrome and the element ($\alpha^{3(n-t)}$) of the Galois field of the second bit train, said means for providing a third bit train $S_1$, and said means for providing a fifth bit train $S_2$ are composed of an exclusive-OR circuit,
   (k) a comparator for comparing an element of the Galois field of the fourth bit train with an element of the Galois field of the fifth bit train,
   (l) a gate circuit for preventing the coincident output of said comparator when the output of said correction inhibit circuit is zero so that said output of the comparator is prevented when all the bit positions of said first syndrome $A_1$ are zero,
   (m) an error correction circuit for inverting an output of said data buffer when an output of said gate circuit is positive, and
   (n) an output terminal coupled with said error correction circuit for providing a corrected code signal.

2. An error correcting system for correcting three simultaneous errors in an input code $C' = (a_1', a_2', a_3', \ldots, a_n')$, (n is a code length and is equal to $n = 2^m - 1$, m is an integer), which is the sum of an original code signal C and a possible error code e comprising:
   (a) an input terminal for receiving a reception code $C'$,
   (b) shift register means for providing a first syndrome $A_1$, a second syndrome $A_2$ and a third syndrome $A_3$ according to the equations:

$$A_1 = \sum_{s=1}^{n} a_s' \alpha^{n-s}$$

$$A_2 = \sum_{s=1}^{n} a_s' \alpha^{3(n-s)}$$

$$A_3 = \sum_{s=1}^{n} a_s' \alpha^{5(n-s)}$$

(c) means for providing $A_1^3 + A_2$ and for detecting if $A_1^3 + A_2 = 0$ or not,
   (d) means for providing $$S_1 = A_1 + \alpha^{n-t}$$

where $\alpha$ is a primitive element of a Galois field $GF(2^m)$ with $2^m$ number of elements, t is an integer equal to or less than n for indicating a test bit,
   (e) means for providing $$S_2 = A_2 + \alpha^{3(n-t)}$$

(f) means for providing $$S_3 = A_3 + \alpha^{5(n-t)}$$

(g) means for providing $$EL(t) = S_1^6 + S_2^2 + S_1^3 S_2 + S_1 S_3$$

(h) means for selecting an output of said means of the paragraph (d) when $A_1^3 + A_2 = 0$ is satisfied, and an output of said means of the paragraph (g) when $A_1^3 + A_2 \neq 0$ is satisfied,
   (i) means for inverting a bit of the code $C'$ according to an output of said means of the paragraph (h) and,
   (j) an output terminal connected to the output of said means of the paragraph (i) to provide a corrected output code.

3. An error correcting system according to claim 2, wherein said means for providing $EL(t) = S_1^6 + S_2^2 + S_1^3 S_2 + S_1 S_3$ comprises a ROM table for providing $S_1^6$, a ROM table for providing $S_2^2$, a ROM table for providing $S_1^3 S_2$, a ROM table for providing $S_1 S_3$, an exclusive-OR circuit for providing $S_1^6 + S_2^2$, an exclusive-OR circuit for providing $S_1^3 S_2 + S_1 S_3$, an exclusive-OR circuit for providing $EL(t)$, a logic circuit for detecting if all the bits of $EL(t)$ are zero or not, and an inverter for inverting the output of said logic circuit.

* * * * *